United States Patent
Weiss et al.

(10) Patent No.: US 9,341,666 B2
(45) Date of Patent: May 17, 2016

(54) METHOD AND DEVICE FOR ESTABLISHING A FAULT IN CONNECTING LINES BETWEEN A CENTRAL UNIT AND A PLURALITY OF ELECTRONIC COMPONENTS WHICH ARE INDEPENDENT OF ONE ANOTHER

(71) Applicants: Timo Weiss, Hemmingen (DE); Matthias Siemss, Gomaringen (DE); Jochen Widmaier, Ditzingen (DE); Guenter Weiss, Walheim (DE)

(72) Inventors: Timo Weiss, Hemmingen (DE); Matthias Siemss, Gomaringen (DE); Jochen Widmaier, Ditzingen (DE); Guenter Weiss, Walheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 175 days.

(21) Appl. No.: 14/360,418

(22) PCT Filed: Nov. 28, 2012

(86) PCT No.: PCT/EP2012/073819
§ 371 (c)(1),
(2) Date: May 23, 2014

(87) PCT Pub. No.: WO2013/079520
PCT Pub. Date: Jun. 6, 2013

(65) Prior Publication Data
US 2016/0041218 A1 Feb. 11, 2016

(30) Foreign Application Priority Data

Nov. 30, 2011 (DE) .......................... 10 2011 087 451

(51) Int. Cl.
*G01R 31/04* (2006.01)
*G01R 31/02* (2006.01)
*G01R 31/00* (2006.01)

(52) U.S. Cl.
CPC ............ *G01R 31/025* (2013.01); *G01R 31/007* (2013.01)

(58) Field of Classification Search
CPC .. G01R 31/025; G01R 31/007; G01R 31/021; G01R 31/024; G01R 31/08; G01R 31/11; G01R 31/1272

USPC .................. 324/620–628, 538–544, 503, 523, 324/527–528, 555, 76.11, 126, 153; 340/3.43, 825.16, 855.1; 702/58, 59, 702/183, 185, 118, 189

See application file for complete search history.

(56) References Cited

U.S. PATENT DOCUMENTS 2,892,153 A * 6/1959 Oswald ................ G01R 31/021
324/527
5,066,919 A * 11/1991 Klassen ............... G01R 31/006
324/503

(Continued)

FOREIGN PATENT DOCUMENTS

DE        EP 0418665 A1 * 3/1991 ................ B60T 8/36
DE        10 2007 059365      12/2008

(Continued)

OTHER PUBLICATIONS

National Instruments, SPICE Simulation Overview, Apr. 11, 2012, www.ni.com/white-paper/5414/en/.*

(Continued)

*Primary Examiner* — Patrick Assouad
*Assistant Examiner* — Sean Curtis
(74) *Attorney, Agent, or Firm* — Norton Rose Fulbright US LLP

(57) ABSTRACT

A method for establishing at least one fault in connecting lines between electronic connection units and peripheral units, which are independent of one another, includes: outputting a start signal from the control unit to a first of the connection units, to start the establishment of the fault; applying a test signal to an interface of a first one of the connection units, the application of the test signal being monitored and/or controlled by a non-volatile first algorithm of the first connection unit; registering a cross-coupling of the test signal to an interface of a second connection unit and storing a fault value representing the cross-coupling in a first register, the registration and the storage of the fault value being monitored and/or controlled by a nonvolatile second algorithm of the second connection unit.

11 Claims, 4 Drawing Sheets

(56) References Cited

U.S. PATENT DOCUMENTS

| | | | | | |
|---|---|---|---|---|---|
| 5,559,427 | A * | 9/1996 | Hinds | G01R 31/021 | 324/519 |
| 5,600,576 | A * | 2/1997 | Broadwater | G01D 9/005 | 702/187 |
| 5,692,043 | A * | 11/1997 | Gliga | H04Q 3/60 | 361/788 |
| 5,873,738 | A * | 2/1999 | Shimada | H01R 23/6873 | 439/61 |
| 6,034,612 | A * | 3/2000 | Heckel | G05B 9/03 | 324/528 |
| 6,130,487 | A * | 10/2000 | Bertalan | B60D 1/62 | 307/9.1 |
| 6,215,315 | B1 * | 4/2001 | Maejima | G11B 15/6835 | 324/539 |
| 6,434,715 | B1 * | 8/2002 | Andersen | G06F 11/0772 | 340/638 |
| 6,457,071 | B1 * | 9/2002 | Thorland | G06F 13/4081 | 710/100 |
| 6,882,158 | B2 * | 4/2005 | Blades | G01R 1/06788 | 324/536 |
| 7,120,559 | B1 * | 10/2006 | Williams | G06F 11/079 | 702/185 |
| 7,124,041 | B1 * | 10/2006 | Johnson | G05B 9/02 | 324/140 R |
| 7,203,881 | B1 * | 4/2007 | Williams | G06F 11/0709 | 702/185 |
| 2005/0082995 | A1 * | 4/2005 | Wakefield | H02P 6/00 | 318/400.12 |
| 2006/0015616 | A1 * | 1/2006 | Chapuis | G06F 1/26 | 709/225 |
| 2007/0208520 | A1 * | 9/2007 | Zhang | H02H 3/335 | 702/58 |
| 2008/0133153 | A1 * | 6/2008 | Almonte | G01R 31/016 | 702/58 |
| 2008/0155293 | A1 * | 6/2008 | Skendzic | H02H 3/044 | 713/340 |
| 2010/0007354 | A1 * | 1/2010 | Deaver, Sr. | G01R 31/025 | 324/539 |
| 2012/0256637 | A1 * | 10/2012 | Juhlin | G01R 31/11 | 324/523 |
| 2014/0207982 | A1 * | 7/2014 | Graff | H04L 12/40032 | 710/69 |
| 2015/0146754 | A1 * | 5/2015 | Werkstetter | H01S 5/06804 | 372/38.07 |
| 2015/0253369 | A1 * | 9/2015 | de Boer | H02H 5/042 | 324/539 |

FOREIGN PATENT DOCUMENTS

| | | | |
|---|---|---|---|
| DE | 102011087451 A1 * | 6/2013 | ............. G01D 3/08 |
| EP | 0 418 665 | 3/1991 | |
| EP | 2786162 A1 | 10/2014 | |
| KR | EP 2437366 A2 * | 4/2012 | .......... H02H 1/0015 |
| WO | 2006008732 A2 | 1/2006 | |
| WO | 2010040587 A1 | 4/2010 | |

OTHER PUBLICATIONS

International Search Report for PCT/EP2012/073819, dated Mar. 21, 2013.

* cited by examiner

METHOD AND DEVICE FOR ESTABLISHING A FAULT IN CONNECTING LINES BETWEEN A CENTRAL UNIT AND A PLURALITY OF ELECTRONIC COMPONENTS WHICH ARE INDEPENDENT OF ONE ANOTHER

BACKGROUND OF THE INVENTION

1. Field of the Invention

The present invention relates to a method for establishing a fault in connecting lines between a central unit and a plurality of electronic components which are independent of one another, to a corresponding device, and to a corresponding computer program product.

2. Description of the Related Art

A cross-coupling test between PSI5 interfaces of one or more ASICs on a circuit board has previously been carried out via software control. However, this is very time-consuming, since the control of the test via software requires a substantial number of commands to be read out and executed. In particular in automotive technology, in which all safety-relevant systems must be thoroughly tested before beginning travel, in future vehicles having a large number of sensors connected to one another as components, this may mean substantial time consumption before the vehicle may be put into operation. This is less comfortable for a user of the vehicle.

BRIEF SUMMARY OF THE INVENTION

The present invention provides a method for establishing at least one fault in connecting lines between a plurality of electronic connection units and a plurality of peripheral units, which are independent of one another, the connection unit being controlled by a volatile algorithm programmed into a control unit, and the connecting lines between the peripheral units and the connection units each being implemented with the aid of at least one two-wire line, the method having the following steps:

- outputting a start signal from the control unit to a first of the connection units, to start the establishment of the fault;
- applying a test signal to an interface of a first of the connection units, the application of the test signal being monitored and/or controlled by a nonvolatile first algorithm programmed into the first connection unit;
- registering a cross-coupling of the test signal to an interface of a second connection unit and storing a fault value representing the cross-coupling in a first register, the registration and storage of the fault value being monitored and/or controlled by a nonvolatile second algorithm programmed into the second connection unit; and
- reading out the at least one fault value by the control unit at least from the first register, to establish the fault in the connecting lines between the first connection unit and the plurality of peripheral units.

Furthermore, the present invention provides a device which is designed to carry out or implement the steps of the method according to the present invention or a variant thereof in corresponding apparatuses. The object on which the present invention is based may also be achieved rapidly and efficiently by this embodiment variant of the present invention in the form of a device.

A device may be understood in the present case as an electrical device, which processes sensor signals and outputs control signals as a function thereof. The device may have an interface, which may be designed in hardware and/or software. In the case of a hardware design, the interfaces may be part of a so-called system ASIC, for example, which contains greatly varying functions of the device. However, it is also possible that the interfaces are independent integrated circuits or are made at least partially of discrete components. In the case of a software design, the interfaces may be software modules which are provided on a microcontroller in addition to other software modules, for example. Cross-coupling is to be understood as transmission of electrical signals, which occurs either by way of an electrically conductive connection between two electrical conductors and/or by way of a wireless transmission of signals between two electrical conductors which come very close to one another.

A computer program product having program code is also advantageous which may be stored on a machine-readable medium such as a semiconductor memory, a hard drive memory, or an optical memory and is used to carry out the method according to one of the above-described specific embodiments or variants thereof when the program product is run on a computer or a device.

A peripheral unit may be understood as an electronic component which is situated in a separate independent housing and is electrically connected or at least connectable via a connecting line to further components. For example, a semiconductor component or a sensor may be understood as a peripheral unit in the meaning of this description. A connection unit may be understood as an electronic unit which is designed as an interface, which is expanded by test functions, for transmitting signals between a central unit and peripheral units. Such a connection unit may be implemented, for example, in the form of an ASIC, in which fixed wiring of control commands or control algorithms is implemented. An interface may be understood as a device for transmitting signals, for example, a cable or a connection plug. A test signal may be understood as a signal having a predefined voltage, in particular a static voltage over a specific predefined period of time. Cross-coupling of the test signal may be understood as an effect of the test signal on another interface, which is caused, for example, by faulty insulation between the two interfaces. Such faulty insulation may be caused, for example, during the production of the interfaces by the unintentional application of a solder tail or damage to an insulation sheath of a cable of the interface. A fault value may be understood in general as an item of information that a fault exists. A register may be understood as a memory which may record the information about an arisen fault. An algorithm may be understood as a processing guideline for processing commands, the processing guideline being implemented fixedly, i.e., statically in hardware of a component. In particular, the algorithm is implemented in a non-volatile way, i.e., not loadable as software into a corresponding computer unit of the component, so that it is erased from the computer unit of the component again after the component is deenergized.

The present invention is based on the finding that a relatively high time requirement and a complexity of a cross-coupling test controlled via software may be substantially reduced by a hardware-based test. In particular, the connection units, which are produced, for example, for contacting peripheral sensors or ASICs in these peripheral sensors, have a hardware circuit in which the algorithm for controlling the cross-coupling test is implemented. In this way, for example, the operational readiness of a control unit equipped with PSI5 interfaces may be achieved more rapidly after the start of a vehicle.

It is favorable if, according to one specific embodiment of the present invention in the step of registering, a registration of a cross-coupling of the test signal to a second interface of the first connection unit and storage of a second fault value representing the cross-coupling in a second register are carried out, the registration of a cross-coupling of the test signal to a second interface of the first connection unit and the storage of the second fault value being monitored and/or controlled by the first algorithm. Such a specific embodiment of the present invention offers the advantage that not only an effect of the test signal on a connection unit other than the connection unit outputting the test signal may be measured, whereby the approach provided here is suited not only for checking connections between individual connection units, but rather also for checking the connection of individual interfaces to one's own connection unit.

According to another specific embodiment of the present invention, a step of applying a further test signal to the interface of the second connection unit may also be provided, the application of the further test signal being monitored and/or controlled by the second algorithm, and furthermore steps of registering a cross-coupling of the further test signal to the first interface in the first connection unit and storing a third fault value representing the cross-coupling of the further test signal in a third register being provided, the steps of registering the cross-coupling of the further test signal and storing the third fault value being monitored by the first algorithm. Such a specific embodiment of the present invention offers the possibility that not only one of the connection units is usable as a "master" for monitoring the freedom from faults of the connecting lines between the components. In this way, a significantly larger number of possible faults may be checked.

According to an additional specific embodiment of the present invention, in the step of registering a cross-coupling of the further test signal, registering of a cross-coupling of the further test signal to at least one second interface of the second connection unit and storing of a fourth fault value representing the cross-coupling in the fourth register may also be carried out, the registering of the cross-coupling of the further test signal and the storing of the fourth fault value being monitored and/or controlled by the second algorithm. Such a specific embodiment of the present invention also offers the advantage that, even if a second connection unit is used as a master for outputting the further test signal, a fault between a connection between two interfaces of the second connection unit may be recognized.

To achieve relief of the software-controlled central unit, carrying out the fault recognition of faults in the connecting lines between the components should take place by one or multiple algorithms implemented in hardware. It is therefore particularly favorable if the switchover of the individual ones of the connection units as "master" to output a corresponding test signal is also carried out by the corresponding algorithms in the particular connection units. According to another specific embodiment of the present invention, prior to the step of applying the further test signal, a control signal may therefore be output from the first algorithm to the second algorithm, to start the application of the further test signal by the second algorithm.

To facilitate a preferably rapid and efficient check of the connections between the control unit of the central unit and the plurality of connection units, after an application of a test signal to an interface of the first connection unit, not only is the effect of this signal on an interface of a second connection unit to be analyzed, but rather also the effect of the test signal on one or multiple further interfaces is to be analyzed. According to one favorable specific embodiment of the present invention, therefore in the step of registering, registering of a cross-coupling of the test signal to an interface of at least a third connection unit and storing of a fifth fault value representing the cross-coupling of the test signal to the interface of the third connection unit in a fifth register may be carried out, the registering of the cross-coupling of the test signal to the interface of the third connection unit and the storing of the fifth fault value being monitored and/or controlled by a non-volatile third algorithm programmed into the third connection unit.

To ensure that a cross-coupling of the test signal to another interface is correctly registered, settling of the test signal on the interface of the first connection unit is to be taken into consideration. According to one specific embodiment of the present invention, a predefined duration may therefore be waited out between the step of application and the step of registration.

To allow particularly rapid storage of the fault values in the affected components or particularly rapid readout of the ascertained fault values by the control unit of the central unit, according to one special specific embodiment of the present invention, in the step of registering, storing of the fault value in the first register may be carried out, the first register being a part of the second connection unit or the first register being a part of the control unit of the central unit.

The above-provided approach may be used particularly advantageously in a scenario in which the method is carried out while using PSI5 interfaces at least as an interface in the first connection unit and as an interface in the second connection unit. In particular, the above-described approach may be used in the field of automotive technology or automotive electronics.

The present invention will be explained in greater detail hereafter as an example on the basis of the appended drawings.

DETAILED DESCRIPTION OF THE INVENTION

Figure 1:
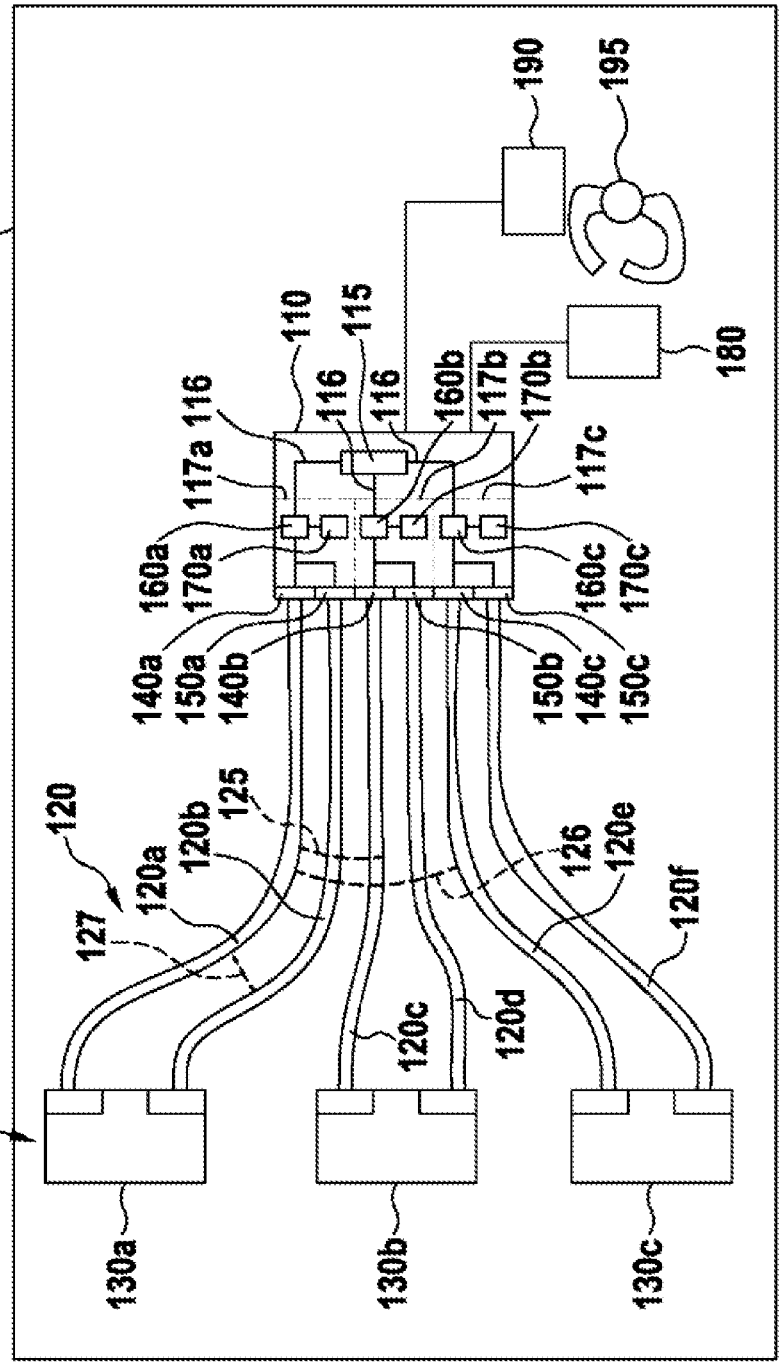
FIG. 1 shows a block diagram of a vehicle, in which an exemplary embodiment of the present invention is used.

In the following description of preferred exemplary embodiments of the present invention, identical or similar reference numerals are used for the similarly acting elements shown in the various figures, a repeated description of these elements being omitted.

FIG. 1 shows a block diagram of a vehicle 100, in which an exemplary embodiment of the present invention is used. A software-controlled central unit 110 is provided in this case. Central unit 110 includes a control unit 115, which is designed, for example, as a microcontroller or digital signal processor and which is connected via an SPI bus 116 to connection units 117, for example, which are provided as a hardware interface for contacting external units (described in greater detail hereafter). Connection units 117 are connected via connecting lines 120, which are each implemented as two-wire signal lines (for example, in the form of a PSI5 connecting line or interface), to interfaces of a plurality of peripheral units 130. In FIG. 1, without restriction of the generality, only three peripheral units 130 are shown, specifically a first unit 130a, a second unit 130b, and a third unit 130c. However, further units 130 (not explicitly shown in FIG. 1) may also be provided, which are connected similarly with the aid of corresponding connecting lines 120 to particular associated connection units 117. Each of connection units 117 includes, for example, a first interface 140, a second interface 150, an algorithm 160, which is stored in a nonvolatile way in hardware of affected connection unit 117, and a register 170, in which one or more fault values may be stored.

Peripheral units 130 may be sensors (for example, acceleration sensors, pressure sensors, or structure-borne noise sensors or the like), which transmit a corresponding sensor signal to one of interfaces 140 or 150 of connection units 117, so that affected connection unit 117 may analyze the signal transmitted from the particular affected sensor and may activate, for example, occupant safety means such as an airbag 180 or a belt tightener 190 to optimize safety of an occupant 195 of vehicle 100.

To connect individual interfaces 140 and 150 of particular connection units 117 of central unit 110 to control unit 115 of the central unit, for example, first interface 140a of first connection unit 117a is connected via a first connecting line 120a to first peripheral unit 130a, second interface 150a of first connection unit 117a is connected via a second connecting line 120b to first peripheral unit 130a, first interface 140b of second connection unit 117b is connected via a third connecting line 120c to a second peripheral unit 130b, second interface 150b of second connection unit 117b is also connected via a fourth connecting line 120d to second peripheral unit 130b, first interface 140c of third connection unit 117c is connected via a fifth connecting line 120e to a third peripheral unit 130c, and a second interface 150c of third connection unit 117c is connected via a sixth connecting line 120f to third peripheral unit 130c of central unit 110. It is also conceivable that each of peripheral units 130 is only connected via one connecting line 120 to a corresponding connection unit 117 of central unit 110.

To now test the correct function and freedom from faults of individual connecting lines 120, previously a test algorithm was executed by software-controlled control unit 115 in central unit 110, which was complex and therefore slow due to the input, interpretation, and execution of individual commands of the test algorithm in control unit 115, however. According to the approach provided here, a signal is transmitted by control unit 115 to first connection unit 117a, for example, to start the carrying out of the fault test by an algorithm 160a, which is implemented in the hardware of first connection unit 117a, or a correspondingly equipped control unit, which may execute this algorithm 160a.

For this purpose, for example, a test signal is applied to first interface 140a of first connection unit 117a. This test signal may include, for example, a predefined voltage level being applied between the two wires of first connecting line 120a. If a fault exists in connections 120, for example, due to damaged insulation or a solder tail 125 between one of the wires of first connecting line 120a and a wire of third connecting line 120c, this fault may be recognized at first interface 140b of second connection unit 117b. In this case, for example, a voltage level on third connecting line 120c will be greater than would be the case without the fault in the form of solder tail 125. Therefore, the cross-coupling of the test signal from first connecting line 120a to third connecting line 120c may be registered at first interface 140b of second connection unit 117b. Second connection unit 117b is in a state in this case in which no test signal is output itself on one of connecting lines 120c and 120d via one of interfaces 140b or 150b, but rather cross-coupling of the test signal to third and/or fourth connecting line 120 or 120d, respectively, is monitored at particular interfaces 140b and 150b. If it is recognized that, for example, due to the presence of fault 125, the test signal is cross-coupled to third connecting line 120c, this may be registered by algorithm 160b, which is fixedly programmed into the hardware of second connection unit 117b, and stored in a corresponding memory or a corresponding register 170b of second connection unit 117b.

In the above-described way, a fault between first connecting line 120a and fifth connecting line 120e may also be recognized at first interface 140c of third connection unit 117c, this fault being caused by a second solder tail 126, for example. In this case, by way of the use of algorithm 160c, which is programmed in a nonvolatile way into the hardware of third connection unit 117c, a fault value representing this fault may be registered at first interface 140c of third connection unit 117c and this fault value may be stored in a register or a memory 170c of third connection unit 1117c.

To also establish a fault (for example, due to a short-circuit 127) between first and second connecting lines 120a and 120b, which in interfaces of a single peripheral unit, for example, first peripheral unit 130a, algorithm 160a or a control unit, which executes algorithm 160a, may also record a fault value representing this fault 127 at second interface 150a of first connection unit 117a and store it in memory or register 170a.

To now be able to preferably register all occurring faults in the connecting lines, a control signal (for example, via SPI bus 116 and control unit 115 of central unit 110) may be transmitted by algorithm 160a of first connection unit 117a to algorithm 160b (or a control unit executing this algorithm) of second connection unit 117b, upon which algorithm 160b in second connection unit 117b (or the control unit which executes this algorithm 160b in second connection unit 117b) outputs a (further) test signal via first interface 140b of second connection unit 117b on third connecting line 120c. This further test signal may correspond, for example, in shape and amplitude to the test signal previously output via first interface 140a of first connection unit 117a. In this way, for example, fault 125, which exists due to the solder tail between first and third connecting lines 120a and 120c, may also be recognized in first interface 140a of first connection unit 117a and may be stored in memory 170a by a corresponding fault value representing this fault 125.

By a repetition of this above-described procedure, for example, each of interfaces 140 and 150 shown in FIG. 1 may be used as a master interface, via which a corresponding test signal is output to associated connecting line 120, in the other interfaces, which are either part of the same connection unit or another connection unit, a test of the particular interfaces for cross-coupling of the test signal applied to the master interface being possible. This check may be carried out without the executions of a corresponding software code in control unit 115 of central unit 110, whereby the execution of the check of the freedom from faults in connecting lines 120 is significantly more rapid than an application of a software-controlled algorithm.

Finally, the fault values stored in registers 170 of individual connection units 117 may be read out by control unit 115 of central unit 110, for example, so that the fault status of particular connecting lines 120 is registered. This readout may again be carried out using a software-based algorithm in central unit 110, for example, since this readout does not require such a large number of commands to be processed and therefore may be executed sufficiently rapidly. Furthermore, only one read command is necessary if one register contains the fault entries of all interfaces.

In contrast, if a cross-coupling test controlled via software (as is carried out in the related art) were carried out, it would require a plurality of control commands to the (PSI5) interfaces to be tested. Each individual PSI5 interface must be turned on and off by software commands and the status of all interfaces is to be registered after each turning-on command.

Figure 2:
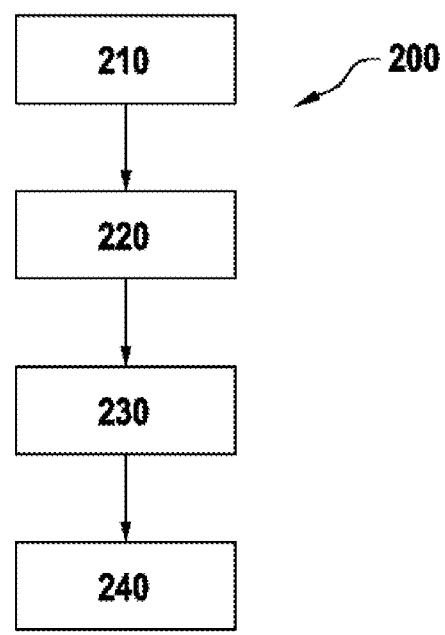
FIG. 2 shows a flow chart of an exemplary embodiment of the present invention as a method.

FIG. 2 shows a flow chart of an exemplary embodiment of the present invention as a method 200 for establishing at least one fault in connecting lines between a central unit, which is controlled by a volatile algorithm programmed into a central unit, and a plurality of electronic components, which are independent of one another. The connecting lines between the central unit and the plurality of components are each implemented with the aid of a two-wire line. Method 200 includes a step of outputting 210 a start signal from the central unit to a first of the components, to start the establishment of the fault. Furthermore, method 200 includes a step of applying 220 a test signal to an interface of a first of the components, the application of the test signal being monitored by a nonvolatile first algorithm programmed into the first component. In this way, a short-circuit-to-ground monitor is implemented. Furthermore, method 200 includes a step of registering 230 a cross-coupling of the test signal to an interface of a second component and storing a fault value representing the cross-coupling in a first register, the registration and storage of the fault value being monitored by a nonvolatile second algorithm programmed into the second component. Finally, the method includes a step of reading out 240 of the at least one fault value by the central unit at least from the first register, to establish the fault in the connecting lines between the central unit and the plurality of components.

A hardware-based cross-coupling test, as was described above, results in a reduction of the test time while simultaneously relieving the (software-controlled main) processor. This is achieved by an automatic test sequence, which does not require any control interventions by the processor during the running test. The commands "start the cross-coupling test" and "read the test result" are typically sufficient. The complexity of the software of the algorithm which runs in the processor is therefore reduced overall.

After the start of the test, the activation and status registration of the individual interfaces is carried out automatically by the test circuit. The test results are stored in result registers.

The test sequence is dependent on the number of components (which are designed as ASICs, for example) having (PSI5) interfaces on a circuit board. In the case of multiple components or ASICs, one component (ASIC) after another becomes the "master (ASIC)", which activates its (PSI5) interface(s) sequentially for a short time (i.e., outputs a test signal to the affected interface) and monitors the particular non-activated interfaces for coupling, as described in greater detail with reference to FIG. 3.

Figure 3:
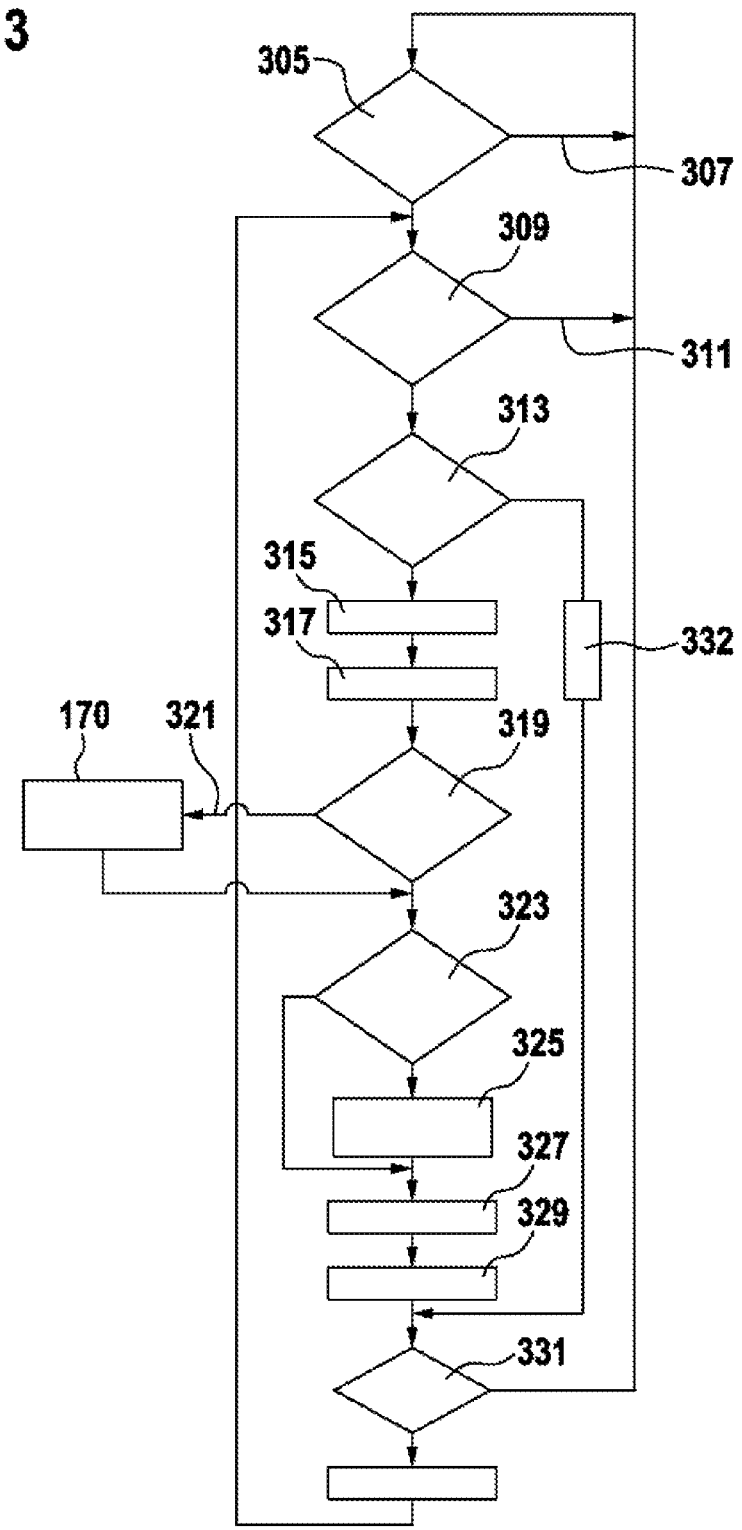
FIG. 3 shows another more detailed flow chart of a method for application in an exemplary embodiment of the present invention.

FIG. 3 shows a flow chart of steps which are carried out, for example, in a master ASIC, i.e., in a connection unit which applies a test signal to an interface. In a first step 305, the corresponding connection unit receives a signal (for example, from central unit 110 from FIG. 1), so that the affected master connection unit may recognize that it may/should operate as a master connection unit. If such a signal is not received, the sequence jumps along path 307 back to step 305, so that the affected connection unit again waits for a corresponding signal of control unit 115, that it may/should operate as a master connection unit. If it is recognized in step 305 that the affected connection unit may/should operate as a master connection unit, a subsequent step 309 is carried out, in which it is checked whether all interfaces to connecting lines are turned off (i.e., deactivated). Therefore, it is checked in step 309 whether all PSI interfaces are turned off. If this is not the case, the sequence jumps back corresponding to path 311 to step 305 and again waits for a signal that the affected connection unit is to operate as a master connection unit. If it is recognized in step 309 that all interfaces to connecting lines are turned off, the sequence jumps to a subsequent step 313, in which it is checked whether no short-circuit to a voltage source (for example, a battery) exists at the nth interface of the component, numeric variable n representing a natural number (beginning at number 1). If it is established in step 313 that actually there is no short-circuit at the nth interface of the connection unit, interface number n is turned on in step 315 and subsequently a predetermined time is waited out corresponding to step 317, so that a voltage level on a connecting line connected to interface number n may settle. Subsequently thereto, it is checked in a step 319 whether a (filtered) output of an interface voltage comparator monitoring interface number n is greater than a predetermined threshold value. If not, corresponding to path 321, a fault value, which represents a fault "short-circuit-to-ground," is stored in a register 170 (corresponding to FIG. 1). Thereafter, the sequence jumps to a step 323, which will be explained in greater detail hereafter. In contrast, if it is established in step 319 that the output on interface number n is greater than the threshold value, it is checked in a subsequent step 323 whether a (filtered) output of an interface voltage comparator, which monitors a further interface of the connection unit, also delivers a value which is greater than a threshold value or is the threshold value. If so, in a subsequent step 325, a logic "1" (as a fault value) is written into a cross-coupling result register (which may also be situated in memory 170, for example), whereby a fault in the form of a short-circuit or a low-resistance connection between interface number n and the further interface of the affected (master) connection unit is recognizable. Subsequently thereto, in a step 327, interface number n of the connection unit is turned off. If it is recognized in step 323 that the output of an interface voltage comparator, which monitors the further interface, delivers a value which is not greater than the threshold value or the output of all interface voltage comparators monitoring the further interfaces of the affected (master) connection unit deliver values which are all not greater than corresponding threshold values, the sequence also jumps to step 327, in which interface number n is turned off. After interface number n is turned off in step 327, a predefined settling time is waited out in step 329. Following step 329, it is checked in step 331 whether the numeric variable corresponds to a number which represents the maximum number nmax of interfaces in the affected (master) connection unit. Also in the case in which, in step 313, a fault "short-circuit to supply voltage" (i.e., for example, to the battery) is recognized, a fault value is stored (step 332), which represents a short-circuit to the supply voltage, for example, the battery, and the sequence jumps further to step 331. If it is recognized in step 331 that presently used numeric variable n is actually less than maximum number nmax of interfaces in the affected (master) connection unit, numeric variable n is incremented by value 1 and the sequence jumps to step 309. If it is recognized in step 331 that presently used numeric variable n is not less than maximum number nmax of interfaces in the affected (master) connection unit, the sequence jumps back to step 305.

The other connection units (for example, ASICs which operate in this case as "slave ASICs" or dependent ASICs) are switched into a monitor mode and monitor their (PSI5) interfaces for possible coupling to the master ASIC (PSI5) interfaces, as described in greater detail with reference to the flow chart according to FIG. 4.

Figure 4:
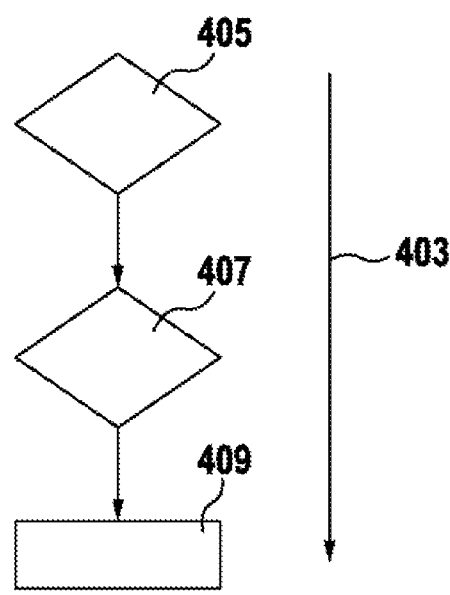
FIG. 4 shows another more detailed flow chart of a method for use in one exemplary embodiment of the present invention.

FIG. 4 shows a flow chart of steps, which are carried out in a dependently operating component (i.e., for example, a dependent ASIC, i.e., an ASIC not operating as a master ASIC or a component not operating as a master connection unit). These steps are carried out in parallel (corresponding to arrow 403 in FIG. 4) in all connection units shown in FIG. 1, which do not operate as a master connection unit. In a first step 405, it is checked whether the affected component (for example, control unit 115 of central unit 110) has received a signal that the affected connection unit is to operate as a controlled connection unit (i.e., as a slave connection unit). If so, the sequence jumps to a subsequent step 407, in which it is checked whether a (filtered) value of an output of an interface voltage comparator, which monitors an affected interface of the particular connection unit, exceeds a certain threshold value. If so, in a subsequent step 409, a fault value is entered in a corresponding cross-coupling result register, which represents a fault of the cross-coupling of the test signal to the affected interface of the (dependent) connection unit.

To study whether the present invention is implemented in a product, control commands for activating the cross-coupling test and for reading the result register may provide evidence for the installation of the present invention in an ASIC. An unambiguous proof of a hardware-based test is possible if the communication between processor and ASICs is interrupted during the test sequence and after running of the test, correct test results are nonetheless stored in the result register.

The exemplary embodiments described and shown in the figures are only selected as examples. Different exemplary embodiments may be combined with one another in their entirety or with respect to individual features. One exemplary embodiment may also be supplemented by features of another exemplary embodiment.

Furthermore, method steps according to the present invention may be carried out repeatedly and in a sequence different than the described sequence.

If an exemplary embodiment includes an "and/or" linkage between a first feature and a second feature, this is to be read to mean that the exemplary embodiment according to one specific embodiment has both the first feature and also the second feature and according to another specific embodiment has either only the first feature or only the second feature.

What is claimed is:

1. A method for establishing at least one test fault in connecting lines between a plurality of electronic connection units and a plurality of peripheral units, the peripheral units being independent from one another, the connection units being controlled by a volatile algorithm programmed into a control unit, and the connecting lines between the peripheral units and the connection units being each implemented with the aid of at least one two-wire line, the method comprising:
outputting a start signal from the control unit to a first one of the connection units to start the establishment of the fault;
applying a test signal to an interface of a first of the connection units, wherein the application of the test signal is at least one of monitored and controlled by a nonvolatile first algorithm programmed into the first connection unit;
registering a cross-coupling of the test signal to an interface of a second connection unit and storing a fault value representing the cross-coupling in a first register, wherein the registration and storage of the fault value is at least one of monitored and controlled by a nonvolatile second algorithm programmed into the second connection unit; and
reading out the at least one fault value by the control unit at least from the first register to establish the fault in the connecting lines between the first connection unit and the plurality of peripheral units.

2. The method as recited in claim 1, further comprising:
registering a cross-coupling of the test signal to a second interface of the first connection unit and storing a second fault value representing the cross-coupling in a second register, the registration of a cross-coupling of the test signal to the second interface of the first connection unit and the storage of the second fault value being monitored by the first algorithm.

3. The method as recited in claim 1, further comprising:
applying a further test signal to the interface of the second connection unit, the application of the further test signal being monitored by the second algorithm; and
registering a cross-coupling of the further test signal to the first interface in the first connection unit and storing a third fault value representing the cross-coupling of the further test signal in a third register, the registration of the cross-coupling of the further test signal and the storage of the third fault value being at least one of monitored and controlled by the first algorithm.

4. The method as recited in claim 3, further comprising:
registering a cross-coupling of the further test signal to at least one second interface of the second connection unit and storing a fourth fault value representing the cross-coupling in a fourth register, the registration of the cross-coupling of the further test signal and the storage of the fourth fault value being at least one of monitored and controlled by the second algorithm.

5. The method as recited in claim 3, wherein, prior to the step of applying the further test signal, a control signal is output by the first algorithm to the second algorithm to start the application of the further test signal by the second algorithm.

6. The method as recited in claim 2, further comprising:
registering a cross-coupling of the test signal to an interface of a third connection unit and storing a fifth fault value representing the cross-coupling of the test signal to the interface of the third connection unit in a fifth register, the registration of the cross-coupling of the test signal to the interface of the third connection unit and the storage of the fifth fault value being at least one of monitored and controlled by a nonvolatile third algorithm programmed into the third connection unit.

7. The method as recited in claim 2, wherein a predefined duration elapses between the applying of the test signal and the registering of the cross-coupling of the test signal to the interface of the second connection unit.

8. The method as recited in claim 2, wherein one of (i) the first register is a part of the second connection unit or (ii) the first register is a part of the control unit.

9. The method as recited in claim 2, wherein the interfaces of the first and second connection units are configured as PSI5 interfaces.

10. The method as recited in claim 1, wherein at least one of a short-circuit to a ground potential and a short-circuit to a supply voltage potential is registered as a cross-coupling of the test signal.

11. A non-transitory, computer-readable data storage medium storing a computer program having program codes which, when executed on a computer, performs a method for establishing at least one test fault in connecting lines between a plurality of electronic connection units and a plurality of peripheral units, the peripheral units being independent from one another, the connection units being controlled by a volatile algorithm programmed into a control unit, and the connecting lines between the peripheral units and the connection units being each implemented with the aid of at least one two-wire line, the method comprising:

outputting a start signal from the control unit to a first one of the connection units to start the establishment of the fault;

applying a test signal to an interface of a first of the connection units, wherein the application of the test signal is at least one of monitored and controlled by a nonvolatile first algorithm programmed into the first connection unit;

registering a cross-coupling of the test signal to an interface of a second connection unit and storing a fault value representing the cross-coupling in a first register, wherein the registration and storage of the fault value is at least one of monitored and controlled by a nonvolatile second algorithm programmed into the second connection unit; and reading out the at least one fault value by the control unit at least from the first register to establish the fault in the connecting lines between the first connection unit and the plurality of peripheral units.

\* \* \* \* \*